United States Patent [19]

Grabbe et al.

[11] Patent Number: 4,642,872
[45] Date of Patent: Feb. 17, 1987

[54] TERMINAL FEEDING AND INSERTION DEVICE

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 826,822

[22] Filed: Feb. 6, 1986

Related U.S. Application Data

[63] Continuation-in-part of Ser. No. 584,274, Feb. 27, 1984, abandoned.

[51] Int. Cl.⁴ .................. B23P 23/00; B23Q 7/00
[52] U.S. Cl. ................... 29/564.6; 29/566.2; 29/739; 29/842; 83/423; 226/52
[58] Field of Search ............ 29/566.2, 566.3, 739, 29/747, 748, 845, 842, 564.2, 564.6; 226/52, 168; 83/423, 110, 517

[56] References Cited

U.S. PATENT DOCUMENTS

| | | | |
|---|---|---|---|
| 3,756,109 | 9/1973 | Kruger | 83/423 X |
| 3,942,788 | 3/1976 | Boyle | 226/168 X |
| 3,948,128 | 4/1976 | Russell | 83/110 |
| 4,216,580 | 8/1980 | Chisholm | 29/747 X |
| 4,263,708 | 4/1981 | Takahashi | 29/564.6 X |
| 4,489,871 | 12/1984 | Bakermans et al. | 226/52 |

FOREIGN PATENT DOCUMENTS 85141  8/1983  European Pat. Off. ............ 226/168

Primary Examiner—William R. Briggs
Attorney, Agent, or Firm—Frederick W. Raring

[57] ABSTRACT

Apparatus for feeding a strip of articles and severing the leading article from the strip comprises a cylindrical surface having a helical feeding thread thereon which is dimensioned to enter gaps in the strip of articles being fed. The strip is fed along a strip feed path to an operating zone adjacent to which one end of the cylindrical surface is located. The cylindrical surface has movable shearing blades thereon at the one end which are cooperable with fixed shearing blades to shear the leading article from the strip in the operating zone.

8 Claims, 8 Drawing Figures

TERMINAL FEEDING AND INSERTION DEVICE

RELATIONSHIP TO OTHER PENDING APPLICATIONS

This application is a continuation-in-part of Application Ser. No. 584,274, filed Feb. 27, 1984 and now abandoned.

FIELD OF THE INVENTION

This invention relates to apparatus for feeding articles in end-to-end strip form and severing the leading article of the strip in an operating zone in which further operations may be performed on the article. The disclosed embodiment is particularly concerned with the feeding of electrical terminals in strip form to an insertion zone in which the terminals are inserted into cavities in an insulating housing or the like.

BACKGROUND OF THE INVENTION

A commonly known type of electrical connector comprises an insulating housing having a plurality of terminal receiving cavities extending into one of its major surfaces and having a terminal in each of the cavities. Connectors of this general description may be of any one of a large number of particular types such as pin and socket type connectors, printed circuit board edge connectors or socket type connectors which are intended to receive an integrated circuit chip carrier.

In the manufacture of connectors of the type described above, it is common practice to produce the terminals in the form of a continuous strip and to assemble the terminals to the connector by means of an insertion machine which is usually of a specialized design as required by the particular type of connector housing and terminal which is assembled to the housing. The insertion machines used for these assembly operations in general feed the terminal strip along a strip feed path, sever the leading terminal of the strip from the strip, transfer the terminal to an inserting ram, and then insert the terminal into one of the cavities of the connector housing. The known types of machines used for these operations have reciprocating parts which push the terminal into the housing after it has been severed from the strip. Under some circumstances, a group of terminals may be severed from the strip and simultaneously pushed into cavities in the housing.

Machines which are used for these assembly operations must be capable of extremely high speed because of the large number of terminals in some types of connector housings and must be capable of precise feeding of the terminal along the feed path into the cavity in the housing, particularly when the terminals are extremely small and are inserted into equally small cavities in the housing. Chip carrier sockets for example have terminal receiving cavities which are spaced apart by only about 0.025 inches or less and the terminals inserted into such cavities commonly will have a thickness of about 0.010 inches or less. It can readily be appreciated that the design of an insertion machine having reciprocating parts which is capable of inserting terminals of this size into cavities and which is in addition capable of high speed operation presents substantial difficulties to the machine designer.

The present invention is directed to the achievement of an improved feeding apparatus for feeding articles such as terminals in end to end strip form along a feed path and severing the leading article from the strip. The disclosed embodiment is particularly concerned with an apparatus for feeding terminals in strip form to an insertion zone in which the terminals are inserted into the cavities in a chip carrier socket housing.

THE INVENTION

In accordance with a broad aspect thereof, the invention comprises a strip feeding means and severing means for feeding a continuous strip of articles, such as electrical terminals, along a strip feed path to an operating zone and severing the leading article on the strip from the strip in the operating zone. The strip has gaps therein at periodic intervals. The strip feeding and severing means is characterized in that a cylindrical support surface is provided, the support surface being mounted for rotation on an axis which extends parallel to, and is adjacent to, the strip feed path. The support surface has a first end, which is adjacent to the operating zone, and a second end which is upstream, relative to the direction of strip feed, from the operating zone. The strip feeding means comprises a feeding thread on the support surface, the feeding thread being dimensioned for reception in the gaps in the strip and having a thread pitch which is equal to the distance between adjacent gaps. The feeding thread extends helically on the support surface from the second end thereof towards the first end. The severing means comprises a fixed shearing member which is beside the strip feed path in the operating zone and a movable shearing member which is movable past the fixed shearing member to sever the leading article on the strip from the strip. The movable shearing member is on, and extends from, the support surface whereby upon rotation of the support surface, the strip is fed and the leading article on the strip is fed to the operating zone. The leading article of the strip is thereafter severed from the strip by the fixed and movable shearing members.

In accordance with one embodiment, the apparatus is intended for use with a strip comprising a continuous flat carrier strip having first and second side edges, the articles being integral with the first side edge and the gaps in the strip comprising notches in the second side edge. In accordance with a further embodiment, the fixed and movable shearing members each have first and second shearing edges, the first shearing edges being effective to shear the leading article in the strip from the carrier strip and the second shearing edges being effective to shear the carrier strip at a location which is adjacent to the article on the strip which is next to the leading article.

THE DRAWING FIGURES

THE DISCLOSED EMBODIMENT

Figure 1:
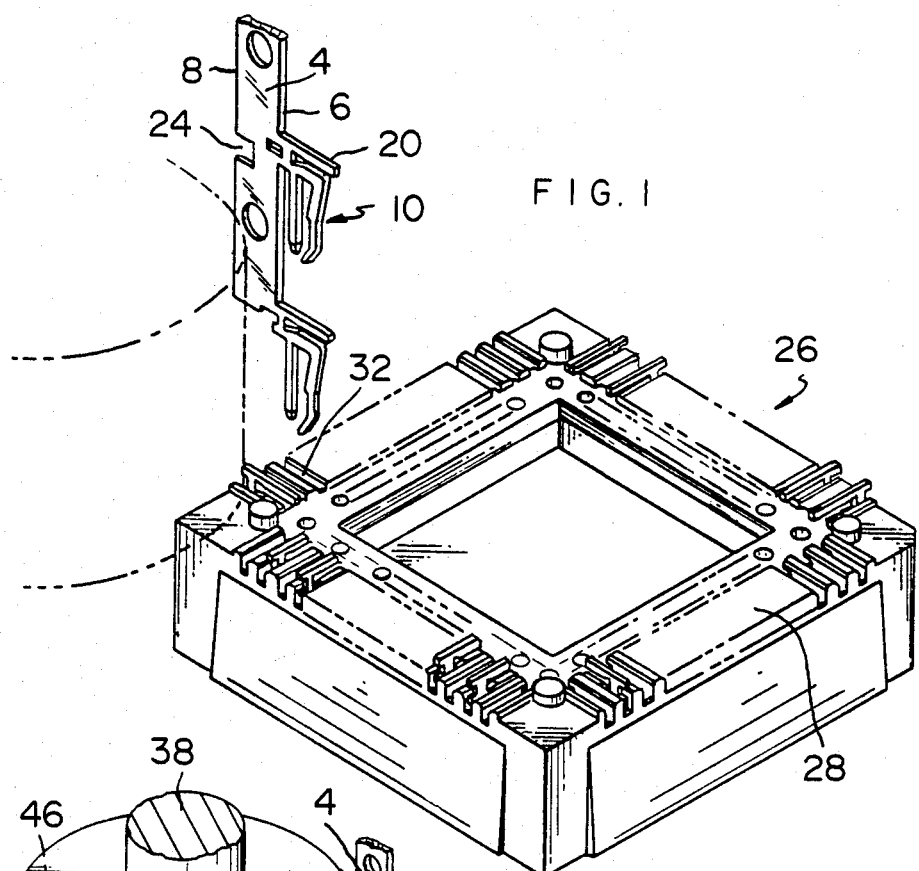
FIG. 1 is a perspective view showing one surface of a chip carrier socket housing and showing a strip of terminals with the leading terminal of the strip in alignment with a cavity in the housing in preparation for insertion of the terminal into the cavity.

The specific embodiment of the invention shown feeds a strip 2 of terminals 10 to an insertion zone in which there is positioned a chip carrier socket housing 26. In the insertion zone, the leading terminal of the strip is severed from the strip and inserted into a cavity in the housing 26 as will be described below.

The strip 2 comprises a continuous flat carrier strip 4 having first and second side edges 6, 8. The terminals 10 extend from the first side edge and are connected thereto by connecting sections as shown. Each terminal has a web portion 12 which extends perpendicularly of the first side edge 6 and first and second arms 14, 16 which extend downwardly as viewed in FIG. 3 from the web 12. A mounting portion 20 extends parallel to the web 12 and is connected to the web by a connecting neck 18. Terminals of the type shown are described in greater detail in our copending application Ser. No. 827,133 (13614) filed Feb. 5, 1986.

The particular terminals shown in FIG. 1 are intended for surface mounting on a substrate and do not have terminal posts for soldering extending from the mounting portion. For surface mounting, the edge 22 (FIG. 6) of the mounting portion of each terminal is positioned on a conductor on the substrate and soldered to the conductor.

The second side edge 8 of the carrier strip 4 is provided with notches 24 at spaced apart intervals, the spacing between adjacent notches being advantageously equal to the spacing between the centers of adjacent terminals and to the pitch of a feeding thread which will be described below.

The chip carrier socket housing 26 has a major surface 28 and side surfaces 30 which extend normally of the major surface. The terminal receiving cavities 32 extend inwardly from the major surface and are in side by side relationship along each side of the housing 26. Each cavity has a rib 34 extending between its internal sidewalls as shown in FIG. 3.

The strip feeding and shearing means for feeding the strip to the insertion zone comprises a cylindrical support surface 36 which is mounted for rotation with respect to a shaft 38 (FIG. 2), the shaft extending parallel to and being adjacent to the feeding path of the strip 2. The cylindrical surface 36 has a first end 40 which is in or adjacent to the insertion zone and a second end 42 which is spaced upstream, with respect to the direction of strip feed, from the insertion zone. A helical feeding thread 44 is provided on the surface 36 and extends from the end 42 towards the end 40 although the end of this feeding thread is spaced from the end 40 of the surface 36. The thread 44 is dimensioned to be received in the notches 24 in the carrier strip 4 so that during each complete rotation of the shaft 38, the strip is fed by a distance equal to the pitch of the thread (that is, the center to center distance of adjacent terminals on the strip). It will thus be apparent that if the shaft 38 is rotated through a complete revolution from the position shown in FIG. 2, the strip 2 will be moved downwardly by a distance equal to the pitch of the feed screw thread and the leading terminal of the strip will be moved partially into the cavity 32 in the housing which is immediately below the leading terminal.

Figure 2:
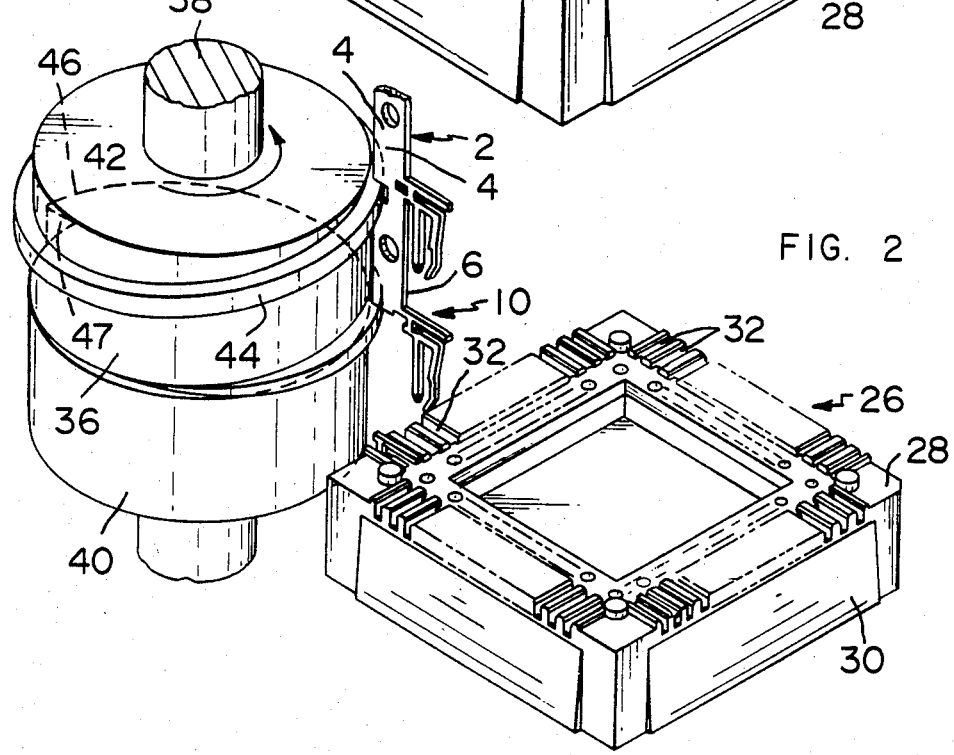
FIG. 2 is a view similar to FIG. 1 but showing a feeding and shearing means in accordance with the invention positioned adjacent to the strip of terminals.
Figure 5:
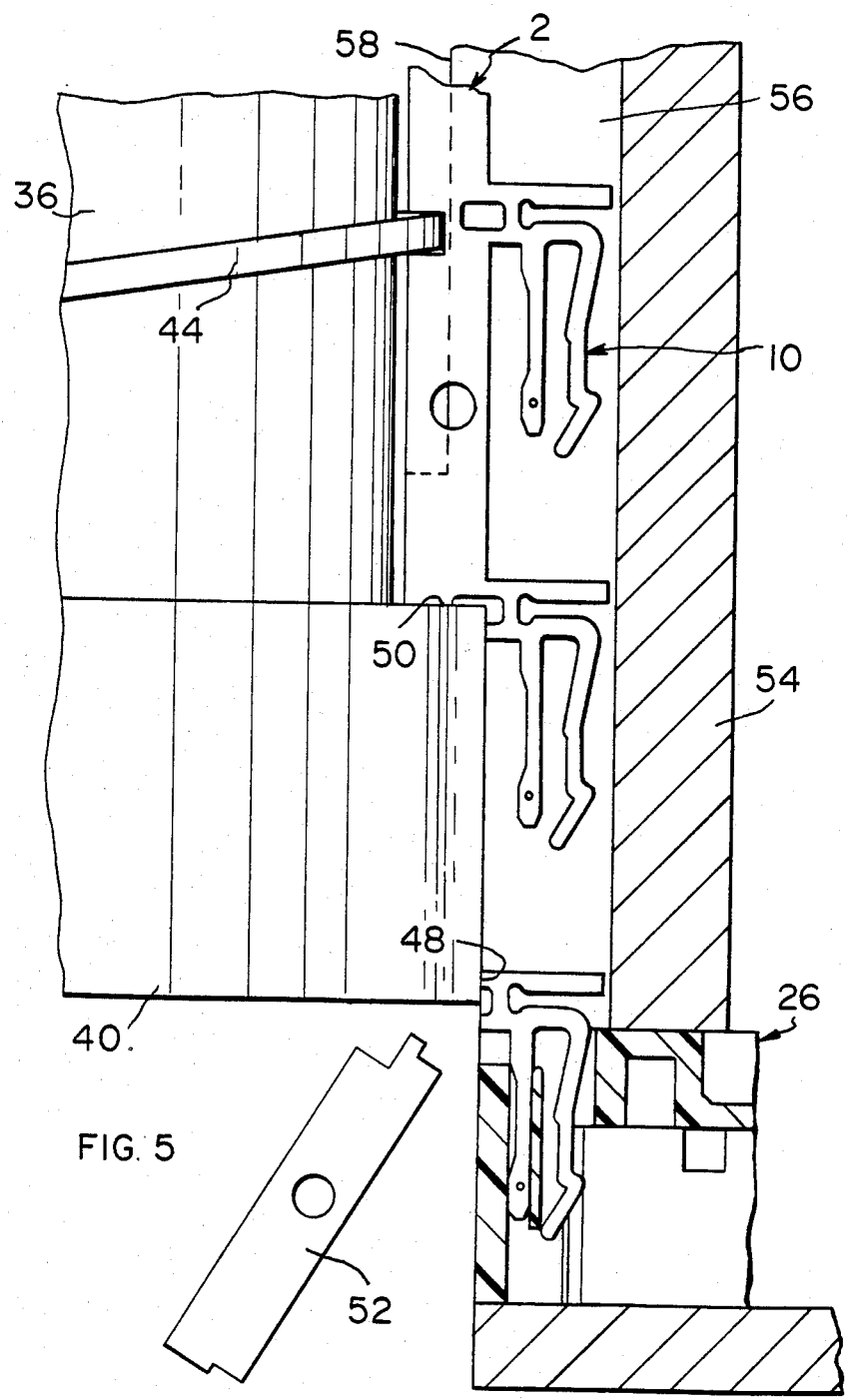
FIG. 5 is a view similar to FIG. 4 illustrating the shearing or severing operation.
Figure 8:
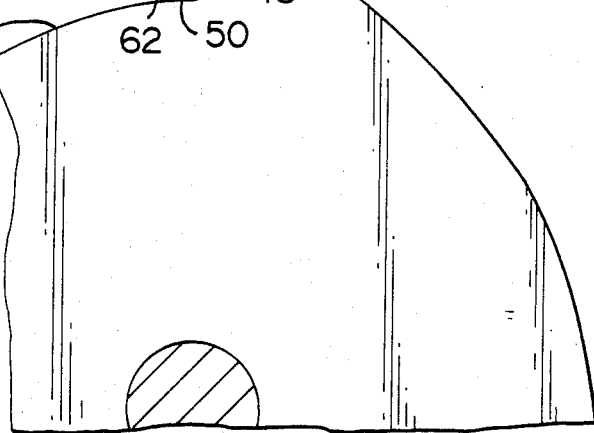
FIG. 8 is a cross sectional view looking in the direction of the arrows 8—8 of FIG. 5, but showing the positions of the parts before shearing.

At the time of insertion of the leading terminal into a cavity 32, this leading terminal is severed from the first edge 6 of the carrier strip and the carrier strip itself is severed along a shearing line which extends between the first and second edges adjacent to the second terminal in the strip, the terminal next adjacent to the lower terminal in FIG. 2. The shearing edges are provided on a ramp 46 that extends spirally away from the cylindrical surface 36 adjacent to or at the lower end 40 of the surface. The ramp has an end surface 47 which extends radially with respect to the surface 36 so that first and second movable shearing edges are provided as shown at 48, 50, see FIG. 8. The first shearing edge 48 is a movable shearing edge which is cooperable with a first fixed shearing edge 60 to sever the terminal from the strip and the second movable shearing edge 50 cooperates similarly with a second fixed shearing edge 62. The first edge 48 extends parallel to surface 36 and the second edge 50 extends perpendicularly of the surface 36. As shown in FIG. 5, upon shearing of the carrier strip by the fixed and movable shearing edges 62, 50, a short section of scrap carrier strip 52 is produced which falls away from the insertion zone.

Figure 3:
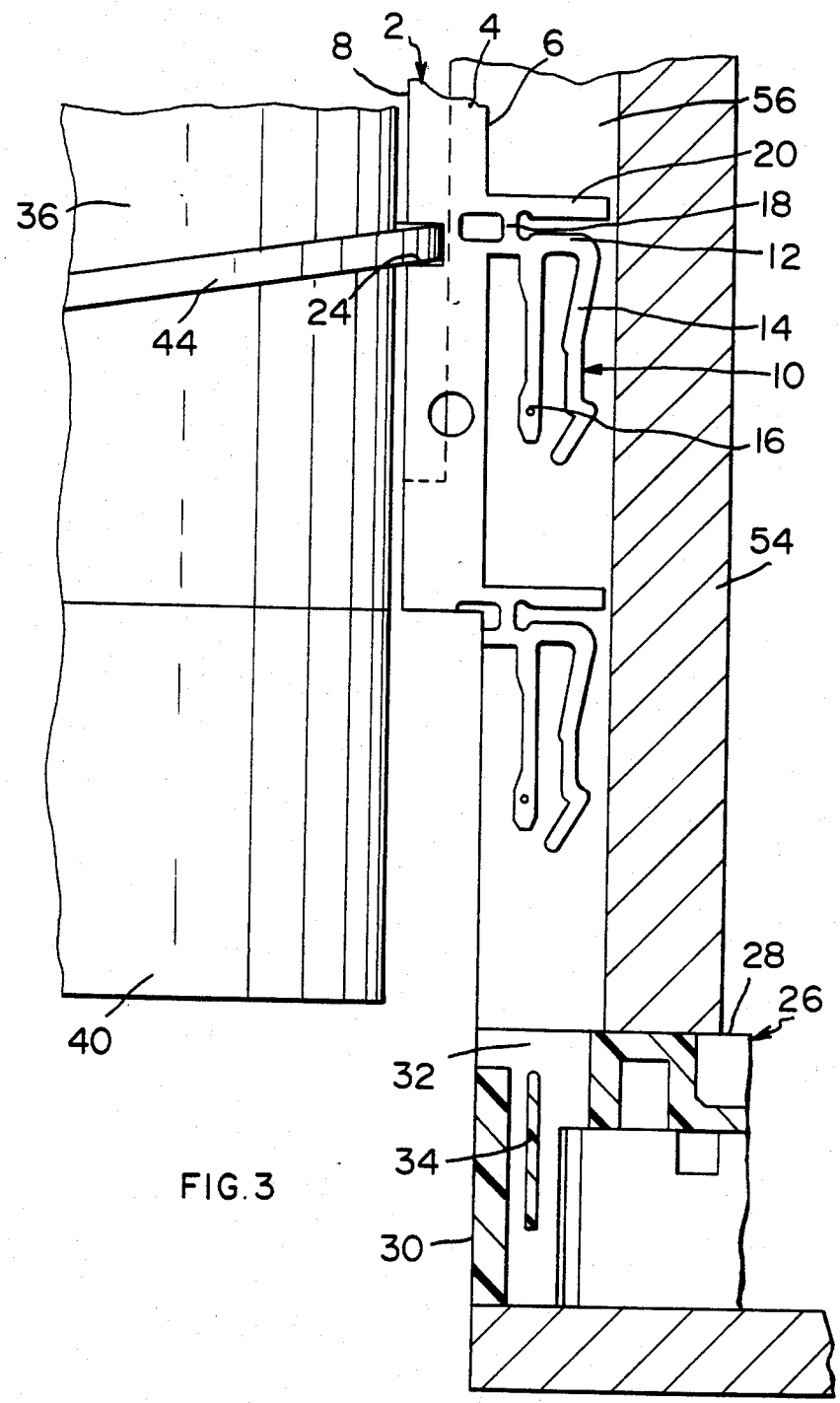
FIG. 3 is a sectional view showing a portion of the chip carrier socket housing and the insertion apparatus, this view showing the positions of the parts at the beginning of an operating cycle and before the srip of terminals has been fed.
Figure 4:
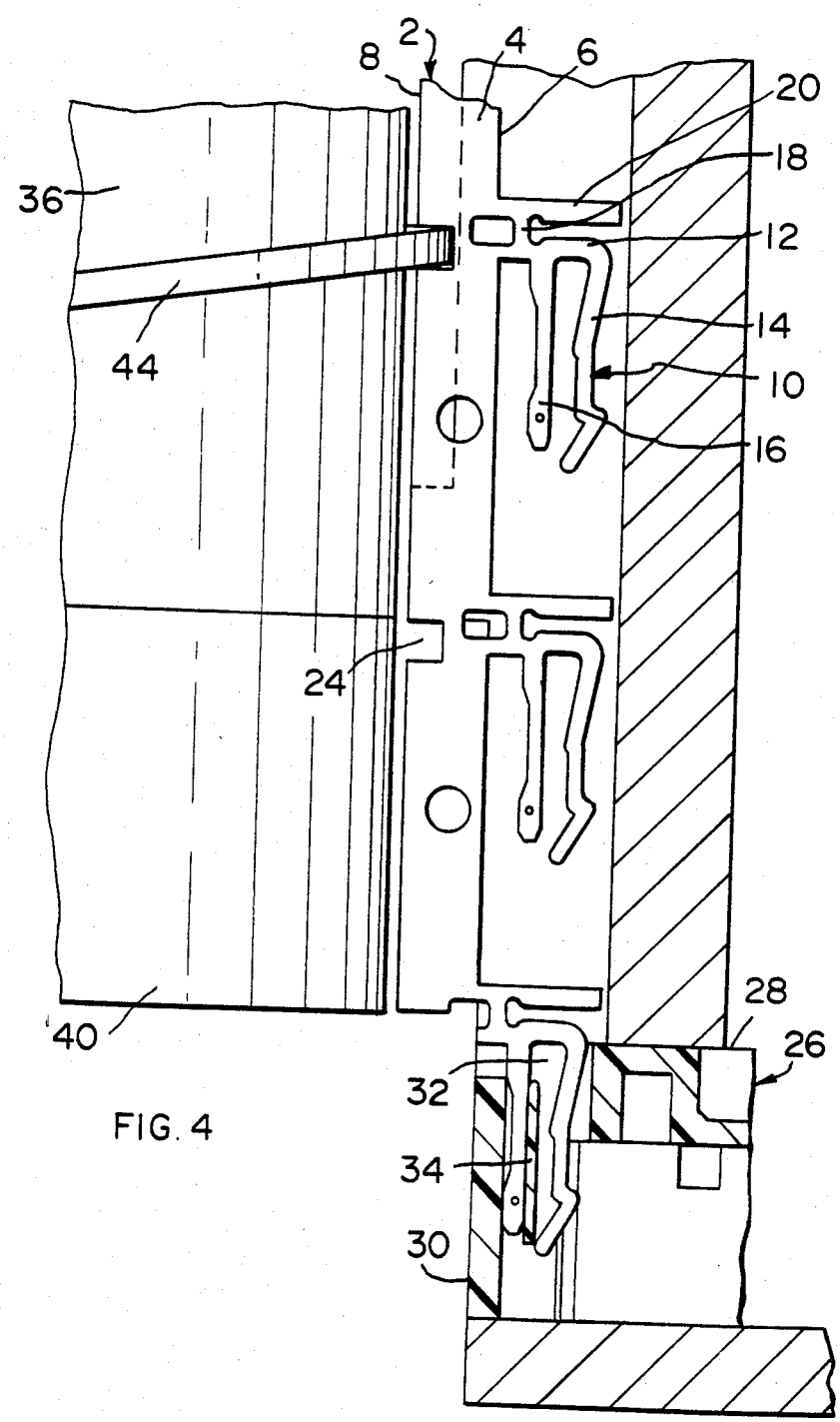
FIG. 4 is a view similar to FIG. 3 but showing the positions of the parts after the feeding operation has been carried out and prior to the shearing operation.

FIGS. 3 through 5 illustrate the operation of the feeding and severing apparatus and show in addition a guide block 54 for the strip 2 which has a slot 56 therein extending inwardly from its lefthand surface 58. The depth of the slot 56 is such that a portion of the carrier strip extends beyond the surface 58 including the notches which receive the thread 44. The lower end of the guide 54 is against or substantially against the surface 28 of the housing 26 and the slot 56 is in alignment with the cavity into which the terminal is inserted in FIG. 3 through 5. It will be understood that a conventional indexing apparatus will be provided for indexing the housing 26 at the completion of every operating cycle so that the cavities in the housing will be successively presented to the insertion station, that is, will be positioned at the lower end of the guide 54. The fixed shearing member having the first and second fixed shearing edges 60, 62 thereon is secured to this guide or mounted adjacent to the guide as shown best in FIG. 8.

It is desirable to design the thread 44 such that after the leading terminal of the strip has been inserted into a cavity in the housing 26, there is a brief dwell in the feeding operation in order to permit the shearing edges to shear the terminal from the strip and to shear the strip itself as shown in FIG. 5. This very brief dwell can be achieved by providing a short section of the feeding thread in a plane which is perpendicular to the axis of the surface 36; in other words, this short section of the thread does not extend helically on the surface 36 but has a "zero pitch" and extends in a circular path around the shaft 38. The angular extent of this short zero pitch section of the thread can be quite small, no more than 15° or 20° of arc of the shaft being required so that the remainder of the surface can be used for the feeding portion of the operating cycle.

Feeding threads of the type shown are described in greater detail in U.S. Pat. No. 4,489,871.

Figures 6, 7:
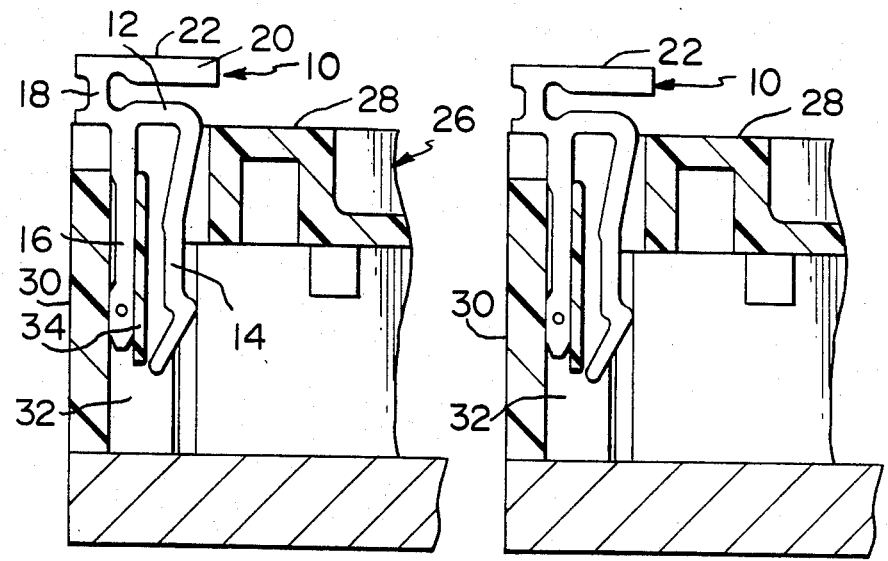
FIG. 6 is a sectional view of the chip carrier socket housing showing a terminal partially inserted by the apparatus shown in FIGS. 1 through 5.
FIG. 7 is a view similar to FIG. 6 showing the position of the terminal in that cavity after complete insertion.

The disclosed embodiment of the invention does not insert the individual terminals 10 completely into the cavities in the housing 26 but only partially inserts the terminals 20 are spaced above the major surface 28 of the housing as shown in FIG. 6. After terminals have been partially inserted into all of the cavities in the housing as shown in FIG. 6, all of the terminals are then fully inserted by means of a suitable tool which engages the edges 22 of the mounting portions and pushes the terminals downwardly until the edges 22 are coplanar with each other and are spaced from the housing surface 28 by a predetermined distance. This assembly technique is highly desirable for the reason that when connectors are surface mounted on a substrate, it is important that the edges, such as the edges 22, which are to be soldered to the conductors on the substrate be coplanar in order that good solder joints will be obtained with all of the terminals.

A complete operating cycle for the apparatus is shown in detail in FIGS. 3 through 5. At the beginning of the operating cycle, FIG. 3, the leading terminal of the strip will be spaced from the insertion zone and the lower portion of the carrier strip will have been severed adjacent to the end of the ramp on which the shearing edges are provided. During rotation of the cylindrical surface, the strip is fed by a distance equal to the pitch of the terminals on the strip as shown in FIG. 4 so that the leading terminal is moved downwardly and is partially inserted into the cavity which is beneath the strip feed path. Thereafter, there is a brief dwell in the feeding operation and the shearing edges shear the terminal from the strip and shear off the end portion 52 of the carrier strip. During this same interval, the housing can be indexed in preparation for the next operating cycle.

A salient advantage of the invention is that all of the machine parts which feed the strip and sever the leading terminal from the strip are mounted on a continuously rotating shaft which rotates at a constant speed in synchronism with the indexing mechanism for indexing the housing. There are no reciprocating parts in the apparatus which must be moved to and fro during each operating cycle and as a result, extremely smooth operation is achieved by the insertion apparatus of the invention. It will also be apparent that the apparatus is extremely simple as compared with inserting machines having reciprocating parts.

We claim:

1. A strip feeding means and severing means for feeding a continuous strip of articles, such as electrical terminals, along a strip feed path to an operating zone and severing the leading article on the strip from the strip in the operating zone, the strip having gaps therein at periodic intervals, the strip feeding means and severing means being characterized in that:

a cylindrical support surface is provided, the support surface being mounted for rotation on an axis which extends parallel to, and is adjacent to, the strip feed path, the support surface having a first end, which is adjacent to the operating zone, and a second end, which is upstream, relative to the direction of strip feed, from the operating zone, the strip feed means comprises a feeding thread on the support surface, the feeding thread being dimensioned for reception in the gaps in the strip and having a thread pitch which is equal to the distance between adjacent gaps, the feeding thread extending helically on the support surface from the second end towards the first end of the support surface, the severing means comprising a fixed shearing member which is beside the strip feed path in the operating zone and a movable shearing member which is movable past the fixed shearing member to sever the leading article on the strip from the strip, the movable shearing member being on, and extending from the support surface whereby, upon rotating of the support surface, the strip is fed in the strip feed direction and the leading article on the strip is fed to the operating zone, and the leading article on the strip is thereafter severed from the strip by the fixed and movable shearing members.

2. A strip feeding means and severing means as set forth in claim 1 which is intended for use with a strip comprising a continuous flat carrier strip having first and second side edges, the articles being integral with the first side edge, the gaps in the strip comprising notches in the second side edge.

3. A strip feeding means and severing means as set forth in claim 2 characterized in that the fixed and movable shearing members each have first and second shearing edges, the first shearing edges being effective to shear the leading article in the strip from the carrier strip, the second shearing edges being effective to shear the carrier strip at a location which is adjacent to the article on the strip which is next adjacent to the leading article.

4. Apparatus for inserting contact terminals into terminal receiving cavities in an insulating housing, the cavities being in side-by-side parallel relationship, each cavity extending inwardly from one surface of the housing, the terminals being integral with a carrier strip, the carrier strip having first and second side edges, the terminals being integral with the first side edge, the second side edge having notches therein on a predetermined notch pitch, the apparatus having an insertion zone, a strip feeder for feeding the strip along a strip feed path which extends towards the insertion zone, and a shearing means for shearing the leading terminal on the carrier strip from the carrier strip, the apparatus being characterized in that:

a cylindrical support surface is provided, the support surface being mounted for rotation on an axis which extends parallel to, and is adjacent to, the strip feed path, the support surface having a first end, which is adjacent to the insertion zone, and a second end which is upstream, relative to the strip feed direction, from the insertion zone, the strip feeder comprising a feeding thread on the support surface, the feeding thread being dimensioned for reception in the notches in the second edge of the carrier strip and having a thread pitch which is equal to the notch pitch, the feeding thread extending helically on the support surface towards the second end of the support surface, the strip shearing means comprising a fixed shearing member and a movable shearing member, the fixed shearing member being beside the strip feed path and adjacent to the insertion zone, the movable shearing member being on the cylindrical support surface adjacent to the second end thereof and being movable past the fixed shearing member during rotation of the support surface, the fixed and movable shearing members having a cooperable pair of first shearing edges for shearing the leading terminal of the strip from the strip whereby, upon placement of the insulating housing in the insertion zone with a cavity in the housing on the strip feed path, and upon rotation of the support surface, the strip is fed in the strip feed direction and the leading terminal of the strip is inserted into the cavity, and the leading terminal is thereafter severed from the strip by the first shearing edges.

5. Apparatus for inserting contact terminals into terminal receiving cavities in an insulating housing, the cavities being in side-by-side parallel relationship, each cavity extending inwardly from one surface of the housing, the terminals being integral with a carrier strip, the carrier strip having first and second side edges, the terminals being integral with the first side edge, the second side edge having notches therein on a predetermined notch pitch, the apparatus having an insertion zone, a strip feeder for feeding the strip along a strip feed path which extends towards the insertion zone, a shearing means for shearing the leading terminal on the strip from the strip and for shearing the carrier strip adjacent to the leading terminal, the apparatus being characterized in that:

a cylindrical support surface is provided, the support surface being mounted for rotation on an axis which extends parallel to, and is adjacent to, the strip feed path, the support surface having a first end, which is adjacent to the insertion zone, and a second end which is upstream, relative to the strip feed direction, from the insertion zone, the strip feeder comprising a feeding thread on the support surface, the feeding thread being dimensioned for reception in the notches in the second edge of the carrier strip and having a thread pitch which is equal to the notch pitch, the feeding thread extending helically on the support surface towards the second end of the support surface, the strip shearing means comprising a fixed shearing member and a movable shearing member, the fixed shearing member being beside the strip feed path and adjacent to the insertion zone, the movable shearing member being on the cylindrical support surface adjacent to the second end thereof and being movable past the fixed shearing member during rotation of the support surface, the fixed and movable shearing members having a cooperable pair of first shearing edges for shearing the leading terminal of the strip from the strip and a second cooperable pair of second shearing edges for shearing the strip along a shear line which is between the first and second side edges of the carrier strip whereby, upon placement of the insulating housing in the insertion zone with a cavity in the housing on the strip feed path, and upon rotation of the support surface, the strip is fed in the strip feed direction and the leading terminal of the strip is inserted into the cavity, and the leading terminal is thereafter severed from the strip by the first shearing edges and the carrier strip is severed by the second shearing edges.

6. Apparatus as set forth in claim 4 characterized in that the second fixed and movable shearing edges are spaced upstream, relative to the direction of strip feed, from the first fixed and movable shearing edges and are adjacent to the terminal which is next adjacent to the leading terminal on the strip whereby the carrier strip is severed adjacent to the next adjacent terminal when the leading terminal of the strip is severed from the strip.

7. Apparatus as set forth in claim 6 characterized in that a strip guide is provided, the strip guide extending to the insertion zone.

8. Apparatus as set forth in claim 7 characterized in that the strip guide has a guide slot extending inwardly from one surface of the guide, the guide slot being dimensioned to receive the terminals on the carrier strip and portions of the carrier strip, other portions of the carrier strip, including the second edge and the notches, being outside of the slot.

* * * * *